(12) United States Patent
Lee

(10) Patent No.: US 8,872,559 B2
(45) Date of Patent: Oct. 28, 2014

(54) NUMERICALLY CONTROLLED OSCILLATOR AND DIGITAL PHASE-LOCKED LOOP

(71) Applicant: Princeton Technology Corporation, New Taipei (TW)

(72) Inventor: Wen-Jan Lee, New Taipei (TW)

(73) Assignee: Princeton Technology Corporation, New Taipei (TW)

( * ) Notice: Subject to any disclaimer, the term of this patent is extended or adjusted under 35 U.S.C. 154(b) by 0 days.

(21) Appl. No.: 13/920,606

(22) Filed: Jun. 18, 2013

(65) Prior Publication Data

US 2014/0159790 A1   Jun. 12, 2014

(30) Foreign Application Priority Data

Dec. 11, 2012  (TW) .............................. 101146525 A

(51) Int. Cl.
*H03L 7/06* (2006.01)
*H03L 7/08* (2006.01)

(52) U.S. Cl.
CPC ..................................... *H03L 7/08* (2013.01)
USPC .......................................... 327/159; 327/150

(58) Field of Classification Search
None
See application file for complete search history.

(56) References Cited

U.S. PATENT DOCUMENTS

| | | | |
|---|---|---|---|
| 4,951,004 A * | 8/1990 | Sheffer et al. ................. | 331/1 A |
| 7,109,808 B1 * | 9/2006 | Pelt ................................ | 331/45 |
| 7,391,839 B2 * | 6/2008 | Thompson .................... | 375/376 |
| 8,090,755 B1 * | 1/2012 | Old ................................ | 708/271 |
| 2010/0194444 A1 * | 8/2010 | Patterson ...................... | 327/106 |
| 2011/0095830 A1 * | 4/2011 | Tsangaropoulos et al. ..... | 331/34 |

* cited by examiner

*Primary Examiner* — Cassandra Cox
(74) *Attorney, Agent, or Firm* — Muncy, Geissler, Olds & Lowe, P.C.

(57) ABSTRACT

A digital phase-locked loop is provided. The digital phase-locked loop includes: a phase-locked loop, for generating an output frequency according to a reference frequency; and a numerically-controlled oscillator, coupled to the phase-locked loop, for generating the reference frequency, in which the numerically-controlled oscillator includes: a phase accumulator (PA), for outputting a sawtooth signal according to a clock signal and a frequency control word; and a most significant bit (MSB) detector, coupled to the phase accumulator, for detecting a most significant bit of the sawtooth signal outputted from the phase accumulator, thereby generating the reference frequency with a square waveform.

7 Claims, 3 Drawing Sheets

NUMERICALLY CONTROLLED OSCILLATOR AND DIGITAL PHASE-LOCKED LOOP

CROSS REFERENCE TO RELATED APPLICATIONS

This Non-provisional application claims priority under 35 U.S.C. §119(a) on Patent Application No(s). 101,146,525, filed in Taiwan, Republic of China on Dec. 11, 2012, the entire contents of which are hereby incorporated by reference.

BACKGROUND OF THE INVENTION

1. Field of the Invention

The present invention is related to the technology for controlling phase-locked loops.

2. Description of the Related Art

A phase-locked loop (PLL) is a control component widely used in the computers and communication circuits. The PLL can be used to trace the input frequency and output a frequency with the same phase of the input frequency.

Integer-N PLL, or Inter-N PLL, is a common phase-locked loop. FIG. 1 is a schematic diagram of an inter-n PLL. Generally, the phase-locked loop 100 at least comprises a voltage-controlled oscillator (VCO) 110 and a phase/frequency detector 120, and is coupled to a reference frequency source 130. The phase-locked loop 100 produces an output frequency fout synchronously according to a reference frequency fref provided by the reference frequency source 130. The voltage-controlled oscillator 110 can provide the output frequency fout to external circuits. The output frequency fout is fed back to the phase/frequency detector 120. The phase/frequency detector 120 is used to compare the reference frequency fref with the feedback output frequency fout. By monitoring the difference between the reference frequency fref and the output frequency fout, the output frequency and phase can be easily locked. In addition, the phase-locked loop 100 usually further comprises a charge pump 140 and a low-pass filter 150 to achieve better performance.

In the inter-N PLL 100, a frequency divider 160 is usually disposed between the reference frequency source 130 and the phase/frequency detector 120, and an additional frequency divider 170 disposed between the voltage-controlled oscillator 110 and the phase/frequency detector 120, as shown in FIG. 1. If the frequency divider 160 is an R-divider and the additional frequency divider is an N divider, the output frequency fout is N/R times the reference frequency fref (the phase-locked loop 100 amplifies the input frequency). Note that the greater the value of R of the divider 160, the smaller the resolution of the phase-locked loop 100. However, In order to maintain the same frequency variation, the value of N increases along with the increase of the value of R, and the phase noises of the entire system significantly increases as well. In response to the phase noises, a high-level low-pass filter 150 is thus required. The contemporary PLL also includes a fractional-N PLL. Although the fractional-N PLL can efficiently improve the frequency resolution without augmenting noise, it is more complicated in structure and thus expensive.

Therefore, the present invention provides a new phase-locked loop which has a simple structure and can be precisely controlled.

BRIEF SUMMARY OF THE INVENTION

The present invention provides a digital phase-locked loop. The digital phase-locked loop comprises: a phase-locked loop (PLL), for generating an output frequency according to a reference frequency; and a numerically-controlled oscillator (NCO), coupled to the phase-locked loop, for generating the reference frequency, in which the numerically-controlled oscillator comprises: a phase accumulator (PA), for outputting a sawtooth signal according to a clock signal and a frequency control word; and a most significant bit (MSB) detector, coupled to the phase accumulator, for detecting the MSB of the sawtooth signal outputted from the phase accumulator, thereby generating the reference frequency with a square waveform.

The present invention also provides a numerically-controlled oscillator. The numerically-controlled oscillator comprises: a phase accumulator, for outputting a sawtooth signal according to a clock signal and a frequency control word; and a most significant bit (MSB) detector, coupled to the phase accumulator, for detecting the most significant bit of the sawtooth signal outputted from the phase accumulator so as to generate the reference frequency with a square waveform.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
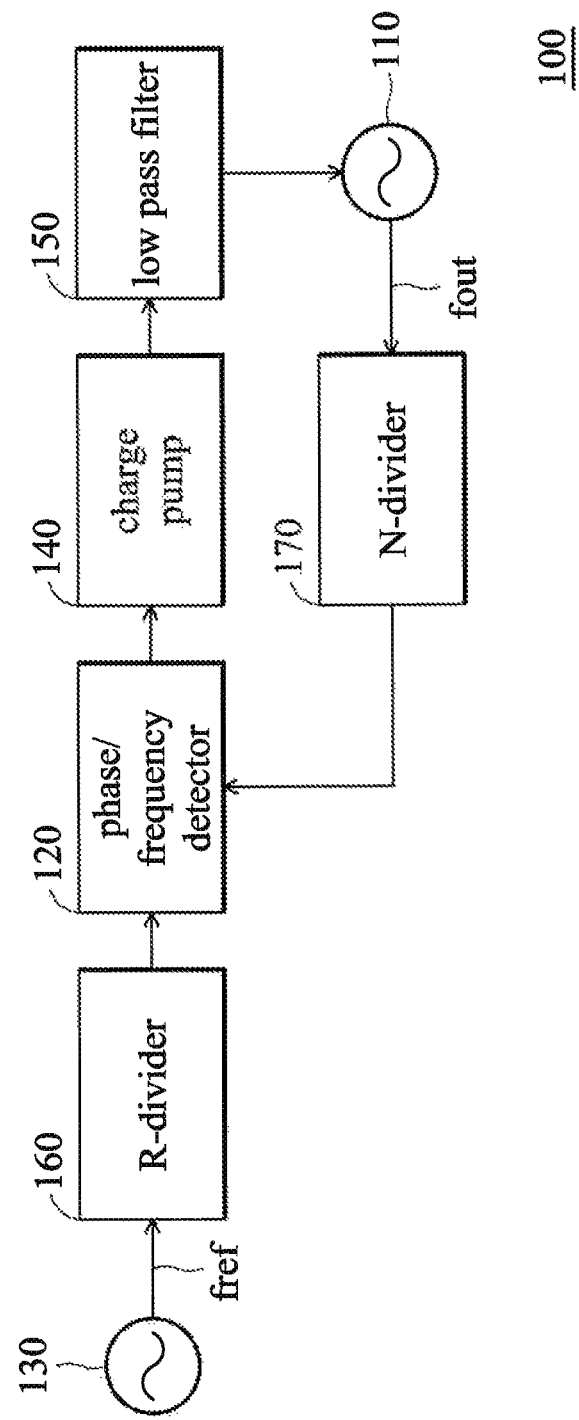
FIG. 1 is a schematic diagram of an inter-n PLL.
Figure 2:
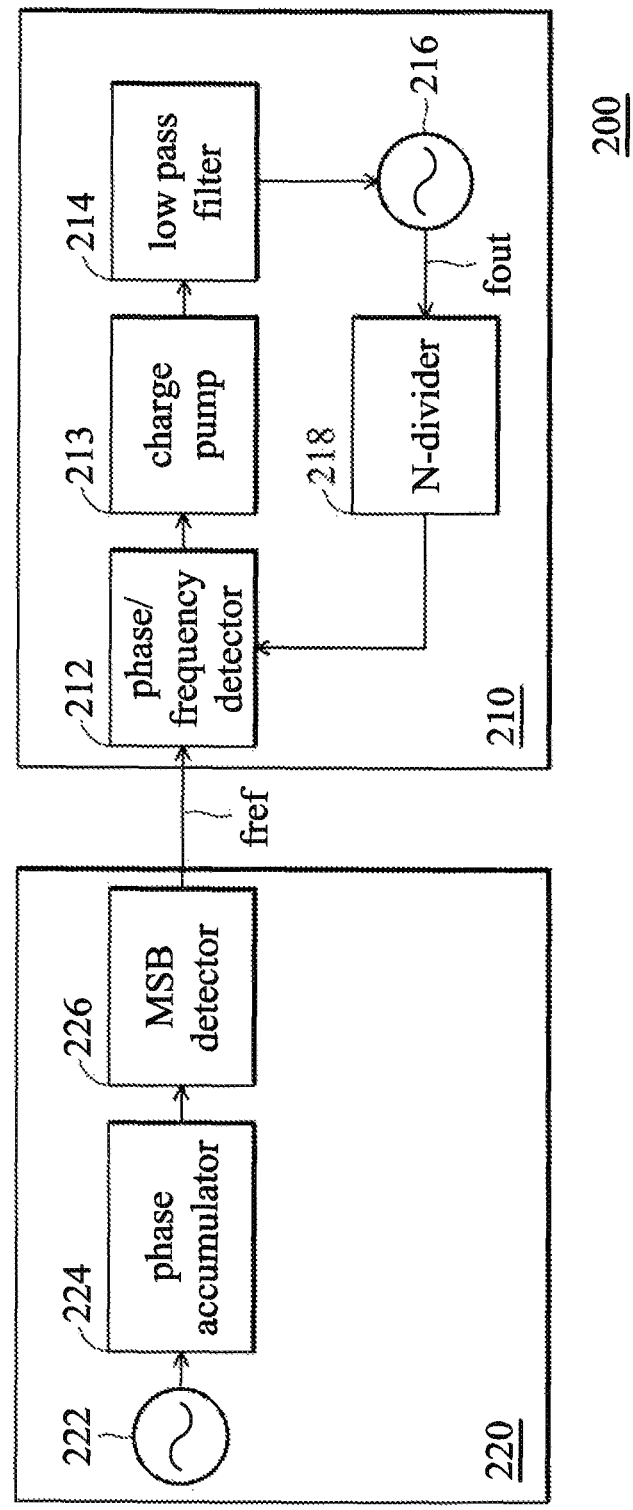
FIG. 2 is a schematic diagram of the digital phase-locked loop according to an embodiment of the present invention.

FIG. 2 is a schematic diagram of the digital phase-locked loop according to an embodiment of the present invention. The digital phase-locked loop 200 of the present invention at least includes: a phase-locked loop (PLL) 210 and a numerically-controlled oscillator (NCO) 220. These components will be further described in the following with reference to FIGS. 2, 3A and 3B.

The phase-locked loop 210 of the present invention is used to output an output frequency fout, where the output frequency fout is synchronously generated according to a reference frequency fref. In this embodiment, the phase-locked loop 210 comprises a phase/frequency detector 212, a charge pump 213, a low-pass filter 214, a voltage-controlled oscillator 216 and an N-divider 218. The voltage-controlled oscillator 216 is used to provide the output frequency fout to external circuits, while the output frequency fout will be fed back to the phase/frequency detector 212. The phase/frequency detector 212 can compare the reference frequency fref with the feedback output frequency fout, and monitor the difference between them to lock the frequency and the phase. The charge pump 214 can charge or discharge the voltage-controlled oscillator 216 according to the comparison result of the phase/frequency detector 212. The low-pass filter 214 can filter off the high frequency component from the output frequency of the phase/frequency detector 212. Note that the phase-locked loop 210 of the present invention can be made up of analog components, digital components, or the combination thereof. This embodiment is merely for illustration, and the phase-locked loop of the present invention can have various arrangements.

Figure 3A:
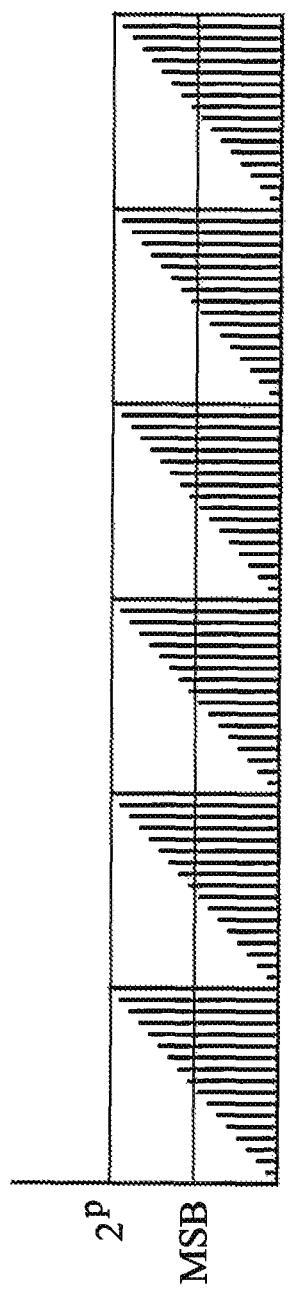
FIG. 3A is a waveform diagram of the output signal of the phase accumulator 224 of the numerically-controlled oscillator 220.
Figure 3B:
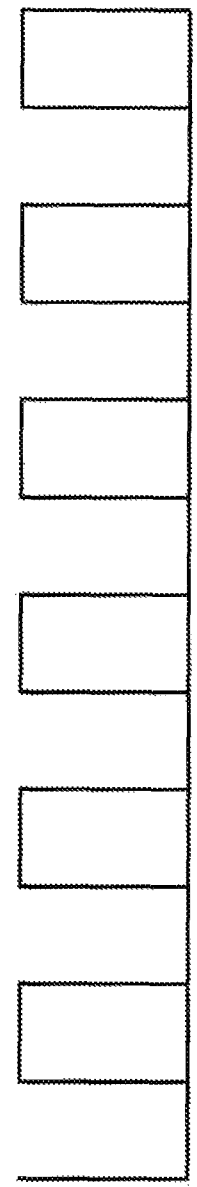
FIG. 3B is a waveform diagram of the output signal of the most significant bit detector 226 of the numerically-controlled oscillator 220.

To prevent the disadvantages in the prior art, the present invention provides a new numerically-controlled oscillator 220. The numerically-controlled oscillator 220 of the present invention is coupled to the phase-locked loop 210, and is used to generate the reference frequency fref required by the phase-locked loop 210 with a simple structure. In FIG. 2, the numerically-controlled oscillator 220 comprises a clock signal source 222, a phase accumulator (PA) 224, and a most significant bit (MSB) detector 226 which is coupled to the phase accumulator 224. FIG. 3A is a waveform diagram of the output signal of the phase accumulator 224 of the numerically-controlled oscillator 220, and FIG. 3B is a waveform diagram of the output signal of the most significant bit detector 226 of the numerically-controlled oscillator 220.

Please refer to FIG. 2 and FIG. 3A. The phase accumulator 224 of the present invention can generate a sawtooth signal according to the clock signal CLK (with a frequency FCLK) provided by the clock signal source 222 and a frequency control word (with a value of FCW) provided by the external circuits. For example, the P-bit phase accumulator 224 successively accumulates the frequency control word FCW one by one according to the timing of the signal CLK, and performs a recount after the accumulated frequency control word FCW reaches the number of $2^P-1$. Thus, a sawtooth signal having a period of $FCLK*FCW/2^P$ is produced.

Note that in the contemporary numerically-controlled oscillator, the sawtooth signal is outputted from the phase accumulator 224 to a phase-to-amplitude converter (PAC) and thus converted to a sinusoidal signal (e.g., a sine signal or a cosine signal). Then, the sinusoidal signal is sent to a digital-to-analog converter (DAC) and converted to a signal which is acceptable by the phase/frequency detector of the phase-locked loop. However, the conventional phase-to-amplitude converter has to find the sinusoidal waveform of the sawtooth signal by querying a lookup table, and the lookup table has to be stored in a memory (for example: a read-only memory). The memory occupies chip area, and thus increases the entire cost of the product. In addition, the phase-to-amplitude converter also has to perform interpolation operations, and therefore the hardware resource is consumed.

In view of this deficiency, the present invention employs a different approach with the prior art. The present invention replaces the aforementioned components with a most significant bit (MSB) detector. Please refer to FIG. 2, FIG. 3A and FIG. 3B. The most significant hit detector 224 can detect the most significant bit (MSB) of the sawtooth signal outputted from the phase accumulator 222. In an embodiment, when the MSB of the sawtooth signal is 0, the MSB detector 224 outputs a low-state signal (i.e., with a phase angle being 0 to 180°, and when the MSB of the sawtooth signal is 1, the MSB detector 224 outputs a high-state signal (i.e., with a phase angle being 180° to 360°). As such, a signal with a square waveform shown in FIG. 3B is generated. Compared to the prior art, the numerically-controlled oscillator 220 of the present invention has a simple structure and is easy to be implemented, and is advantageous by reducing the size and cost of the entire circuit. When the square waveform is used as the reference signal for the phase/frequency detector 212 of the phase-locked loop 210, the alias frequency can be prevented.

In the previous embodiments, the clock signal source 222 is built in the numerically-controlled oscillator 220. However, in alternative embodiments, the numerically-controlled oscillator 220 may not include the clock signal source, and the clock signal CLK can be provided by external signal sources. In addition, one or more than one frequency multiplier can be disposed between the clock signal source 222 and phase accumulator 222 for generating various channels with different frequencies, and a multiplexer can be disposed for selecting an appropriate channel for the phase accumulator 222 based on application requirements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital phase-locked loop, comprising:
    a phase-locked loop (PLL), for generating an output frequency according to a reference frequency; and
    a numerically-controlled oscillator (NCO), coupled to the phase-locked loop, for generating the reference frequency, wherein the numerically-controlled oscillator comprises:
        a phase accumulator (PA), for outputting a sawtooth signal according to a clock signal and a frequency control word; and
        a most significant bit (MSB) detector, coupled to the phase accumulator, for detecting a most significant bit of the sawtooth signal outputted from the phase accumulator, thereby generating the reference frequency with a square waveform.

2. The digital phase-locked loop as claimed in claim 1, wherein the phase-locked loop comprises a phase/frequency detector, for comparing the reference frequency with the output frequency.

3. The digital phase-locked loop as claimed in claim 2, wherein the phase-locked loop further comprises a voltage-controlled oscillator, for outputting the output frequency.

4. The digital phase-locked loop as claimed in claim 3, wherein the phase-locked loop further comprises a charge pump, for charging or discharging the voltage-controlled oscillator according to a comparison result from the phase/frequency detector.

5. The digital phase-locked loop as claimed in claim 1, wherein the numerically-controlled oscillator further comprises a clock signal source.

6. A numerically-controlled oscillator, comprising:
    a phase accumulator, for outputting a sawtooth signal according to a clock signal and a frequency control word; and
    a most significant bit detector, coupled to the phase accumulator, for detecting a most significant bit of the sawtooth signal outputted from the phase accumulator, thereby generating the reference frequency with a square waveform.

7. The numerically-controlled oscillator as claimed in claim 6, further comprising a clock signal source.

* * * * *